United States Patent [19]

Wilson

[11] Patent Number: 4,973,910
[45] Date of Patent: Nov. 27, 1990

[54] SURFACE POTENTIAL ANALYZER

[76] Inventor: Mahlon S. Wilson, 4 Arbol Ct., Los Alamos, N. Mex. 87544

[21] Appl. No.: 314,286

[22] Filed: Feb. 21, 1989

Related U.S. Application Data

[63] Continuation of Ser. No. 143,711, Jan. 14, 1988, abandoned.

[51] Int. Cl.⁵ .......................... H01L 29/60; G01R 5/28
[52] U.S. Cl. ................................. 324/457; 324/458; 324/72; 324/109; 357/25
[58] Field of Search ................. 357/25; 324/71.1, 72, 324/72.5, 457, 458, 109

[56] References Cited

U.S. PATENT DOCUMENTS

| | | | |
|---|---|---|---|
| 3,404,341 | 10/1968 | Young | 324/109 |
| 3,667,036 | 5/1972 | Seachman | 324/457 |
| 4,147,981 | 8/1979 | Williams | 324/458 |
| 4,267,511 | 5/1981 | Suzuki | 324/458 |
| 4,370,616 | 1/1983 | Williams | 324/458 |
| 4,488,556 | 12/1984 | Ho | 357/25 |
| 4,716,448 | 12/1987 | Kelly | 357/25 |
| 4,778,769 | 10/1988 | Forrest | 357/25 |

FOREIGN PATENT DOCUMENTS

| | | | |
|---|---|---|---|
| 3434542 | 4/1986 | Fed. Rep. of Germany | 324/457 |
| 0628761 | 9/1982 | U.S.S.R. | 324/457 |
| 1061057 | 12/1983 | U.S.S.R. | 324/457 |

Primary Examiner—Reinhard J. Eisenzopf
Assistant Examiner—Jose M. Solis
Attorney, Agent, or Firm—Samuel M. Freund

[57] ABSTRACT

The invention is an instrument for determining the work functions (unbiased) or absolute surface potentials (biased) of conducting sample surfaces. These values are inferred from measured surface potential differences between the sample and the instrument's non-contacting sensor. Charge incurred in the sensor by the proximity and surface potential of the sample surface alters the impedance of a semiconductor channel within the sensor. The deviation in the charge dependent impedance of the sensor from a calibrated zero-field reference is used by a feedback controller to alter the base potential of the sensor to eliminate the deviation signal. In this state, the surface potential of the sensor matches that of the sample thus forming a zero-field condition, as a result no charge is induced in the sensor. The surface potential difference between the sample and the sensor is then equal to the sensor base voltage, which is directly measured by a voltmeter. Due to the absence of induced charge in the zero-field condition, the measurement is independent of the sample/sensor separation.

4 Claims, 4 Drawing Sheets

SURFACE POTENTIAL ANALYZER

This is a continuation of co-pending application Ser. No. 07/143,711 filed on Jan. 14, 1988, now abandon.

FIELD OF THE INVENTION

The invention relates generally to a device for nonintrusively measuring the work functions and surface potentials of electrically conducting surfaces.

DESCRIPTION OF THE PRIOR ART

Although a variety of methods for determining the work function of surfaces are available (e.g. P. M. Gundry and F. C. Tompkins in "Experimental Methods in Catalytic Research," R. B. Anderson, Ed., Academic Press, NY (1968) p100–168, or L. W. Swanson and P. R. Davis, Sol. State Phys., 22 1 (1987)), the majority of techniques require the stimulated emission of electrons (intrusive) from the sample surface, thereby considerably altering the natural state of the surface. The nonintrusive techniques available measure the contact potential difference (CPD) between the surface of interest and a second, non-contacting reference surface or probe. The CPD is equal to the difference in the work functions of two metal surfaces electrically connected. A transfer of charge occurs between the two metals until their respective Fermi energies are equilibrated. The strength of the electric field formed by the charge accumulated on the surfaces depends on the capacitance of the system and the magnitude of the CPD. Since the charge is at equilibrium, it is not possible to measure the CPD directly with a voltmeter, instead it is necessary to perturb the system in some manner.

The most common CPD measurement technique, the Kelvin-Zisman (vibrating capacitor) method, utilizes a mechanically vibrated non-contacting probe. Vibration of the probe causes a corresponding variation in the capacitance between the probe and sample surface. If the circuit connecting the two surfaces has a high impedance, an AC voltage signal will result when there is a non-zero electric field. Experimentally determining the actual CPD is accomplished by introducing an external bias to the probe that equilibrates the surface potentials of the sample and the probe, thus eliminating the electric field. Once the system is tuned to the zero-field condition, no signal is generated during vibration of the probe, and the applied bias measured by a voltmeter is equivalent to the CPD. The process is typically automated using a negative feedback integrator on the output of a lock-in amplifier to maintain the proper equilibrating bias. This control scheme was first developed for vibrating reed electrometers by H. Pavlesky, R. K. Swank and R. Grenchik (Rev. Sci. Instrum., 18 298 (1947)). The Kelvin-Zisman apparatus is unfortunately unwieldy and the technique possesses several inherent problems associated with the vibrating probe such as interference from stray capacitances and coupling of the electromechanical driver signal, as well as dependencies of the measurements on the probe displacement (P. P. Craig and V. Radeka, Rev. Sci. Instrum., 41 258 (1969)) and vibrational amplitude (R. E. Simon, Phys. Rev., 116 613 (1959)). In my invention the CPD is measured without the need of a mechanical stimulus, therefore the measurement apparatus is greatly simplified.

This invention utilizes a probe consisting of charge sensitive semiconductor sensor for a reference surface whose effective electrical conductance is a function of surface charge. Various devices exist that incorporate surface charge dependent conducting channels (e.g., R. S. C. Cobbold, "Theory and Applications of Field-Effect Transistors," Wiley, N.Y. (1977)), however, they invariably utilize an integral gate to introduce the electric field that incurs the charge in the channel. The most common of such devices is the metal-oxide-semiconductor field effect transistor (MOSFET). Another similar device is the thin film transistor. While the sensor of my invention is an unique device, the theory of its function is conveniently described using transistor terminology.

SUMMARY OF THE INVENTION

The invention consists of a device for nonintrusively measuring the surface potential of a sample relative to a sensor. The sensor contains a charge sensitive semiconductor conducting channel, through which current flows at a rate dependent upon charge accumulation at the channel surface. The base potential of the sensor is automatically adjusted by negative feedback until the current is restored to a value corresponding to a zero induced charge condition. In this condition the base potential of the sensor is equivalent to the surface potential difference between the sample surface and the sensor.

DESCRIPTION OF THE PREFERRED EMBODIMENT

Figure 1:
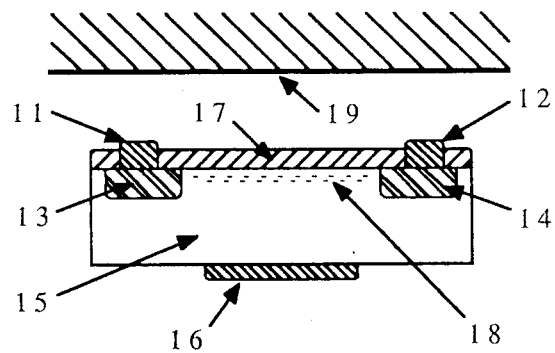
FIG. 1 depicts an n-type depletion sensor of this invention.

The primary components of the preferred embodiment are the sensor and its associated electronic circuitry. A depiction of the sensor in proximity to a sample surface is provided in FIG. 1. A source terminal 11 and a drain terminal 12 supply external electrical continuity to two n-type doped semiconductor regions 13 and 14. The remainder of the semiconductor wafer consists of a p-type substrate 15 with an electrical contact 16. A thin electrically insulating oxide layer 17 covers the substrate 15. An electric field is formed between the sample surface 19 at surface potential $V_G$ and the substrate 15 at roughly the base potential $V_B$. The sample surface 19 possessing surface potential $V_G$ must be conductive and may not be electrically isolated, otherwise charge could not be induced upon it. The electric field forms an inversion layer in the p-type substrate 15 that transforms the impacted area into an n-type channel 18 that provides electrical continuity between the source 13 and drain 14 semiconductor regions. The n-p-n junctions formed by semiconductor regions 13-15-14 between the source 11 and drain 12 effectively form two back-to-back diodes, therefore current can not flow either direction until the inversion n-type channel 18 is formed. If a voltage $V_{DS}$ is applied across the source 11 and drain 12 terminals, a drain current $I_D$ proportional to the carrier density in the channel 18 will flow. The drain current depends upon the surface potential difference $V_{GB}$ between the sample 19 and substrate 15, the capacitance of the system formed by the two surfaces, and the voltage drop across the channel 18 $V_{DS}$. Because of the capacitance dependency, the sensor drain current $I_D$ is highly sensitive to the sample/sensor separation. Consequently, the closer the sensor 20 is to the sample 19 the more sensitive the device becomes.

Figure 2:
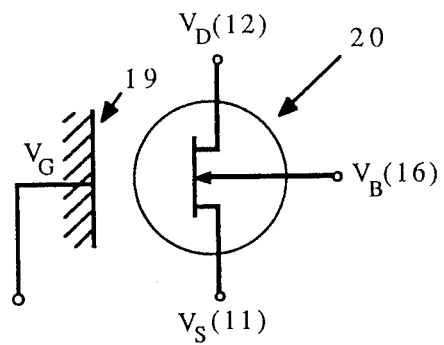
FIG. 2 introduces an electrical symbol for the sensor.

To further illustrate the relationship between the various potentials, and for the convenience of later figures, FIG. 2 introduces a depiction of the sensor 20 consistent with customary electronic symbols. The symbol for the sensor 20 represents components 11 through 18 of FIG. 1. The electrical connections 11,12 and 16 on the sensor 20 with their respective potentials $V_S$, $V_D$ and $V_B$ are labeled for clarity. Also depicted in the figure is a sample 19 with surface potential $V_G$.

For this invention it is necessary to detect both positive and negative surface potential differences ($V_{GB}$'s). This is accomplished using an n-channel depletion device in which sufficient charge carriers intrinsically exist in the channel 18 to allow a current $I_D$ to flow even if the surface potential difference $V_{GB}$ is zero. The value of the potential difference $V_{GB}$ at which the drain current is reduced to zero is the threshold voltage $V_T$, and in an n-channel depletion device this value is negative. Therefore, a negative $V_{GB}$ actually depletes the carrier concentration and the drain current $I_D$ correspondingly decreases. A positive $V_{GB}$ induces charge carriers which increases the drain current. The presence of charge carriers in the channel 18 during the zero-field condition are induced by trapped positive charges in the oxide layer 17. The net result of this stable local electric field is a slightly different effective work function of the sensor as observed by the sample surface. Therefore, the CPD measured by the invention is not equivalent to the true work function difference of the sample 19 and the semiconductor substrate 15, but for the implementation of the invention it does not matter once the instrument is calibrated.

Whereas the sensor 20 described above is a n-p-n depletion type device (p-type substrate, n-channel), it is also possible to produce the desired negative-positive $V_{GB}$ response through the implementation of a p-n-p depletion type device (n-type substrate, p-channel). In the later device the threshold voltage $V_T$ is positive.

The objective of this invention is to measure the unknown work function (plus any bias should it exist) of the sample surface 19. Because of the dependency of the sensor drain current $I_D$ on the separation between the sensor 20 and sample surface 19 previously mentioned, it is impractical to attempt a direct correlation between the potential difference $V_{GB}$ and the drain current. My invention proposes instead to alter the base potential $V_B$ of the sensor to such a value that the intrinsic potential difference between the surfaces is compensated for by an externally imposed bias, in other words, set $V_{GB}=0$. Due to the lack of an electric field, no charge carriers are induced by the sample 19 in channel 18, and the drain current is equivalent to the zero-field current. The zero-field situation thus eliminates the dependence of the drain current on the sensor 20 to surface 19 separation. In order to observe the null condition, the drain current must respond to both positive and negative surface potential differences ($V_{GB}$'s), thus the necessity of using a depletion type device becomes evident.

The sensor 20 is essentially an induced charge controlled resistor. A drain current $I_D$ flows through the inversion channel 18 upon introduction of a drain voltage $V_{DS}$. The potential of the face of the substrate 15 with respect to the surface of sample 19 varies from $V_{DG}$ at the drain 14 to $V_{SG}$ at the source 13. Therefore, the number of charge carriers at a specific location in the channel is dependent upon the potential at that point. In the zero-field condition, only a portion of the channel is actually free of incurred charge, the higher potential section is partially depleted and additional carriers are formed in the lower potential area. A bottleneck that limits the current occurs at that portion of the channel with the fewest charge carriers, which is next to the drain region 14 for a positive DC voltage $V_{DS}$. Since some incurred charge is present in the channel 18, a true zero-field condition is not achieved, therefore the drain current $I_D$ is weakly dependent upon the capacitance of the system. The problem is alleviated if a small drain voltage $V_{DS}$ is used, resulting in a minimal potential drop across the channel. According to MOSFET theory (e.g., C. T. Sah and H. C. Pao, IEEE Trans. Electron. Devices, 13 393 (1966)), the dependence of the null condition on the capacitance would disappear for small $V_{DS}$.

Figure 3:
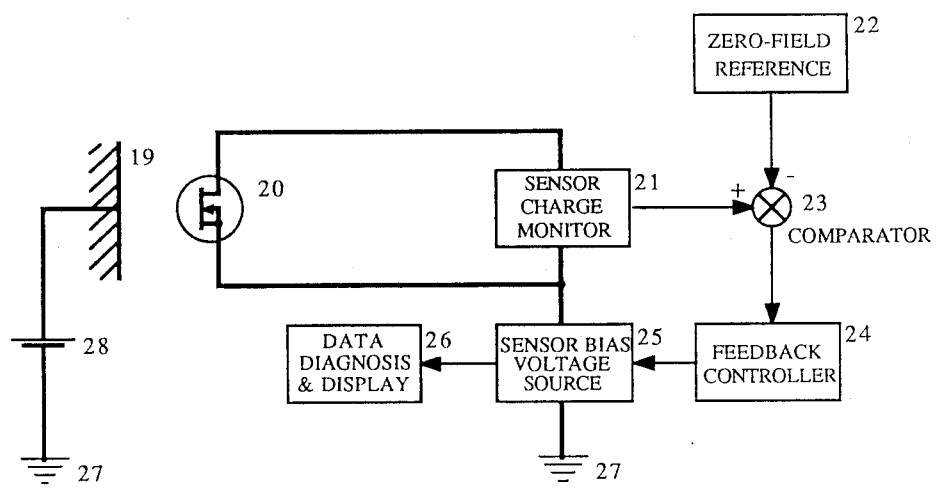
FIG. 3 is a block diagram of the basic components of the invention.

The surface equilibration process allows the use of a circuit that automatically adjusts the sensor substrate 15 bias to maintain the zero-field state during changes in the potential difference per Pavlesky et al. (see Prior Art). For example, in the vibrating capacitor technique the deviation signal from the lock-in amplifier is integrated with the output voltage used directly as the sensor bias. In my invention this is accomplished by comparing the deviation of the sensor current $I_D$ from its zero-field value and using the difference as the offset parameter for an automatic feedback control loop which maintains the proper bias. FIG. 3 is a block diagram of the basic components and functions of my invention. In this example the substrate 16 and source 11 contacts are connected (i.e., $V_B=V_S$). The charge incurred in the sensor 20 (dependent upon the surface potential and proximity of the sample surface 19) is detected by a monitor 21. The monitor 21 senses the charge incurred in semiconductor substrate 15 by measuring the the resistance of the sensor 20. This resistance is compared to a calibrated zero-field reference 22 by a comparator 23. The difference between the two provides an offset value for a feedback control 24 that regulates voltage source 25 to bias the sensor circuit with respect to ground 27. This configuration maintains the substrate 15 surface potential $V_B$ equivalent to the sample 19 surface potential $V_G$ resulting in the zero-field condition $V_{GB}=0$. A diagnostic circuit 26 measures the bias voltage 25, deducts the known effective work function of the sensor 20, and provides a display of the calculated sample surface potential $V_G$. The inferred sample surface potential is equivalent to the work function if the sample is directly grounded, or it is equivalent to the summation of the work function and an external sample bias 28, should it exist.

Figure 4:
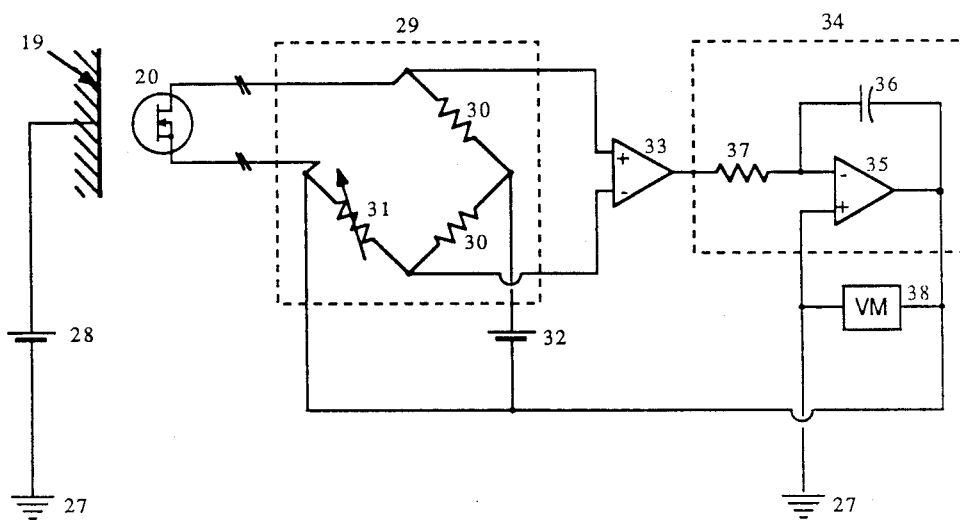
FIG. 4 depicts a circuit schematic that demonstrates the objectives of the invention.

FIG. 4 depicts a circuit for determining the potential difference between the sample surface 19 and the sensor 20. A Wheatstone bridge 29 with resistors 30 and variable resistor 31 elements and a stable constant voltage source 32 are used to monitor the deviation of the sensor drain current $I_D$ from the zero-field condition. The bridge 29 is initially calibrated for the zero-field condition by adjusting the variable resistor 31 until the bridge 29 is balanced, at which point the output of the differential operational amplifier 33 is zero. In this circuit the constant voltage source 32, the bridge 29 and the differential op-amp 33 accomplish the functions of the sensor charge monitor 21 and the comparator 23 in FIG. 3.

similarly, the zero-field reference (22, FIG. 3) function is performed by the variable resistor 31. The amplified difference signal from the differential op-amp 33 is integrated and then inverted by an integrator 34 consisting of op-amp 35 with capacitor 36 and resistor 37 circuit elements. The output of the integrator 34 is used to bias the circuit with respect to ground 27. Thus both the feedback control 24 and sensor bias voltage source 25 functions in FIG. 3 are accomplished by the integrator 34 in this embodiment. A voltmeter 38 measures the circuit bias and displays the surface potential difference between the sample 19 and sensor 20.

When the sensor 20 is placed in the proximity of the sample surface 19, the current $I_D$ through the sensor 20 will increase if the sample 19 is at a higher surface potential, or decrease if it is lower. The output of the differential op-amp 33 will correspondingly be either a positive or a negative voltage proportional in magnitude to the difference in the surface potentials. For example, if the sample surface 19 is at a higher potential than the sensor substrate 15, then the resistance and the voltage drop across the sensor 20 decreases. The potential drop across the bridge 29 sensed by the differential op-amp 33 is integrated and inverted by the integrator 34. Therefore the original voltage output of the integrator 34 becomes somewhat more positive. Since the bias of the sensor 20 correspondingly becomes more positive, the surface potential of the sensor 20 approaches that of the sample 19, and eventually matches it, thus zeroing the deviation signal. The use of a depletion type sensor 20 also accommodates sample 19 surfaces with a lower potential ($V_G < V_B$), therefore the response of the circuit is to maintain the zero condition and rapidly track changes in the sample potential. Large gains in the differential op-amp 33 and the integrator 34 provide the instrument with a rapid response time. The simple circuit described here merely illustrates how the objectives of the invention can be achieved, and is not intended to constrain the invention to this design alone. A practical circuit would invariably be more complex, and may use entirely different means to accomplish the same functions.

If the sensor 20 or its electrical cables are to be used in an environment possessing adverse electrical noise, the interference may be reduced by modulating the output of differential amplifier, 33. The signal response of the sensor is then filtered by a narrow bandwidth filter or by a lock-in amplifier operating at the characteristic source frequency. Noise from external sources with frequencies outside of the filter band are eliminated, thus improving the stability and resolution of the measurements.

The invention is useful for measuring either the CPD or the absolute potential difference (when there is an external bias on the sample) between two surfaces. In the former case, surface scientists can use the device for determining the work functions of experimental samples. In the latter case, the device may be used as a nonintrusive voltmeter, useful for measuring the electrical potentials of devices, wires, or traces that are enveloped by insulation or are buried within circuit boards. If the control loop has an appropriately fast response rate, AC voltages may also be measured.

While the above descriptions contain many specifities, these should not be construed as limitations on the scope of the invention, but rather as exemplifications of preferred embodiments thereof. Various other features and advantages not specifically enumerated will undoubtedly occur to those versed in the art, as likewise will many variations and modifications of the preferred embodiments illustrated and the variations thereto enumerated, all of which may be achieved without departing from the spirit and scope of the invention as defined by the following claims.

I claim:

1. A device for nonintrusively measuring the surface potential difference between a sample surface and a non-contacting sensor comprising in combination:
   (a) a sensor comprising:
      (i) a generally flat, semiconductor substrate having an unblocked first face to which face the sample surface under investigation can be placed in close proximity, and a second, opposing face;
      (ii) a first semiconductor region in electrical contact with said semiconductor substrate located in the vicinity of the first face;
      (iii) a second semiconductor region in electrical contact with said semiconductor substrate located in the vicinity of the first face and spaced apart from said first semiconductor region, said first semiconductor region and said second semiconductor region forming two back-to-back diode junctions with said semiconductor substrate;
      (iv) an electrically insulating oxide layer substantially covering the first face of said substrate and said first semiconductor region and said second semiconductor region;
      (v) means for providing electrical contact with said first semiconductor region;
      (vi) means for providing electrical contact with said second semiconductor region;
      (vii) means for providing electrical contact to the second face of said semiconductor surface;
      (viii) means for providing voltage between said electrical contact means to said first semiconductor region and said electrical contact means to said second semiconductor region; and
      (ix) means for providing a voltage to said electrical contact means to the second face of said semiconductor substrate such that the potential difference between the sample surface and said insulating oxide layer may be adjusted to be substantially zero; and
   (b) means for monitoring the impedance of said sensor.

2. The device as recited in claim 1, wherein said semiconductor substrate is a p-type semiconductor and wherein each of said first semiconductor region and said second semiconductor region is an n-type semiconductor, thus forming an n-p-n junction.

3. The device as recited in claim 1, wherein said semiconductor substrate is an n-type semiconductor and wherein each of said first semiconductor region and said second semiconductor region is a p-type semiconductor, thus forming a p-n-p junction.

4. The device as recited in claim 1, wherein said means for providing electrical contact to the second face of said semiconductor substrate and said electrical contact means to said first semiconductor region are placed in electrical contact.

* * * * *